United States Patent
Itoi et al.

(10) Patent No.: US 6,423,285 B1
(45) Date of Patent: Jul. 23, 2002

(54) METHOD FOR PRODUCING SILICON SINGLE CRYSTAL AND PRODUCTION APPARATUS THEREFOR, AS WELL AS SINGLE CRYSTAL AND SILICON WAFER PRODUCED BY THE METHOD

(75) Inventors: Kirio Itoi, Nishishirakawa-gun; Eiichi Iino, Annaka; Tohru Ishizuka, Nishishirakawa-gun; Tomohiko Ohta, Nishishirakawa-gun; Izumi Fusegawa, Nishishirakawa-gun, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/674,858

(22) PCT Filed: Mar. 6, 2000

(86) PCT No.: PCT/JP00/01337

§ 371 (c)(1),
(2), (4) Date: Nov. 7, 2000

(87) PCT Pub. No.: WO00/55393

PCT Pub. Date: Sep. 21, 2000

(30) Foreign Application Priority Data

Mar. 17, 1999 (JP) .......................................... 11-071205
Mar. 17, 1999 (JP) .......................................... 11-071208

(51) Int. Cl.$^7$ .............................................. C01B 33/26
(52) U.S. Cl. .................... 423/328.2; 117/30; 117/32; 117/917

(58) Field of Search ................................ 117/19, 20, 30, 117/32, 917; 423/328.2

(56) References Cited

FOREIGN PATENT DOCUMENTS

| JP | 62-256788 | 11/1987 |
| JP | 9-183692 | 7/1997 |
| JP | 9-188590 | 7/1997 |

*Primary Examiner*—Felisa Hiteshew
(74) *Attorney, Agent, or Firm*—Oliff & Berridge, PLC

(57) ABSTRACT

In a method for producing a silicon single crystal by growing a single crystal ingot while a magnetic field perpendicular to a crystal growth axis is applied to a silicon melt contained in a quartz crucible during pulling of the single crystal from the melt contained in the quartz crucible, the crystal growth is performed so that one of a low temperature region and a high temperature region generated at a surface of the silicon melt contained in the crucible should always cover a solid-liquid interface of the crystal growth, or a ratio of vertical magnetic field component to horizontal magnetic field component for magnetic field strength at the crystal center of the surface of the silicon melt contained in the quartz crucible is controlled to be 0.3 or more and 0.5 or less. There are provided methods for producing a silicon single crystal based on the CZ method in which a horizontal magnetic field is applied, which can produce a silicon single crystal ingot of high uniformity of interstitial oxygen concentration along the growth direction of the grown single crystal with high productivity and high yield.

15 Claims, 5 Drawing Sheets

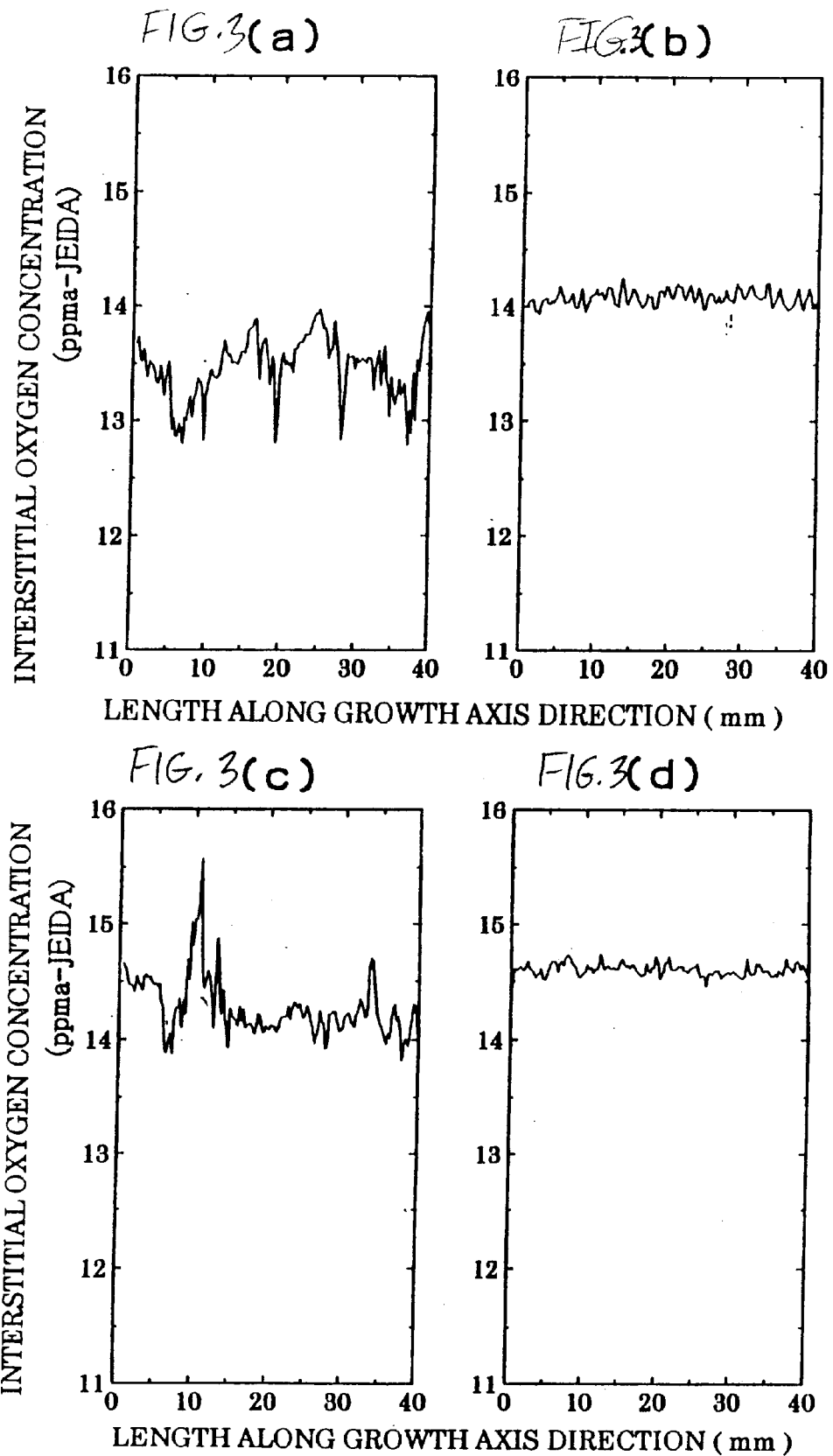

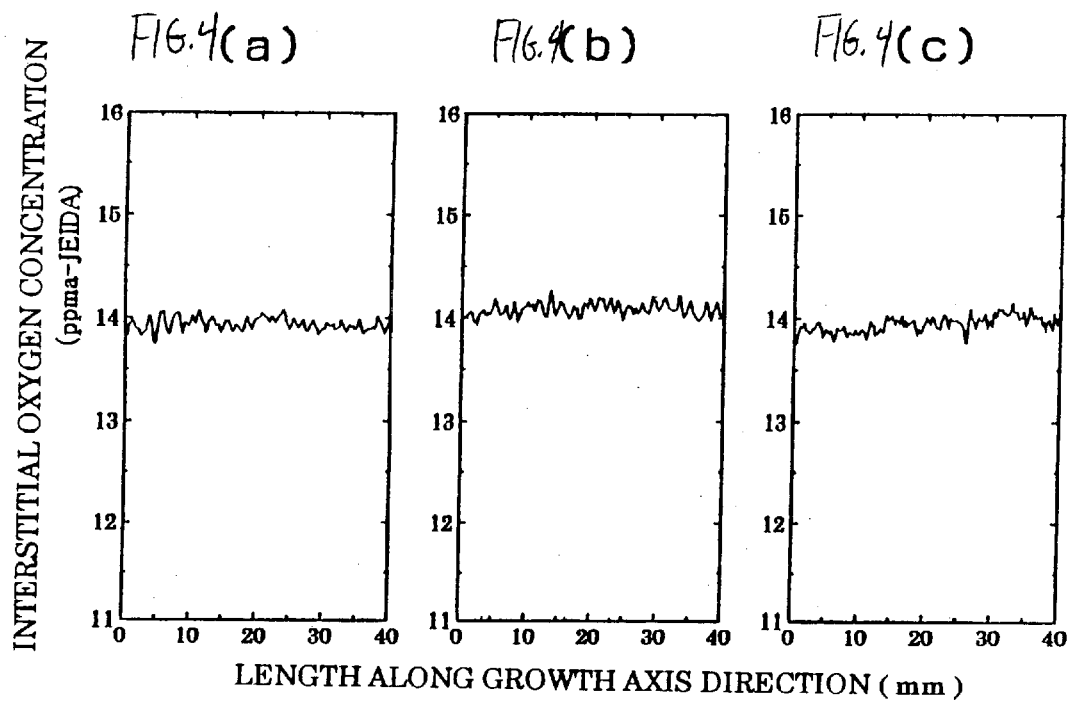
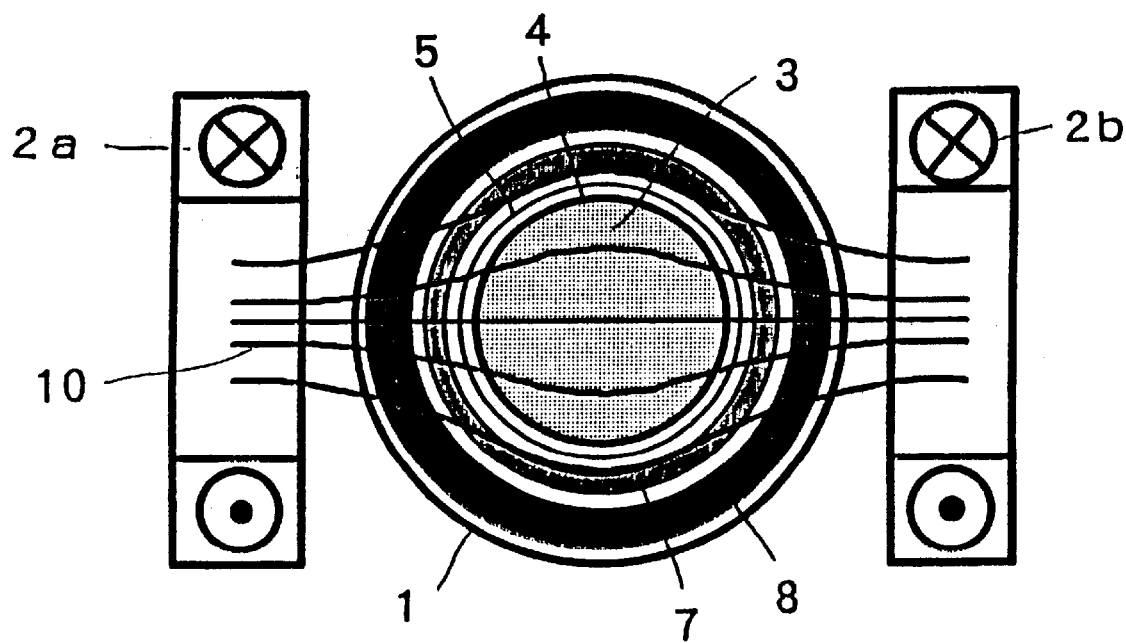
FIG. 5

METHOD FOR PRODUCING SILICON SINGLE CRYSTAL AND PRODUCTION APPARATUS THEREFOR, AS WELL AS SINGLE CRYSTAL AND SILICON WAFER PRODUCED BY THE METHOD

BACKGROUND OF THE INVENTION

1. Field of the Invention

The present invention relates to a method and apparatus for producing a silicon single crystal wherein a silicon single crystal ingot is grown by the Czochralski method in which a horizontal magnetic field is applied (Horizontal Magnetic-field-applied Czochralski Method, HMCZ method) and so forth.

2. Description of the Related Art

As a method for producing a silicon single crystal used for the production of semiconductors, the Czochralski method (CZ method) is widely used, in which a crystal is pulled from silicon melt contained in a quartz crucible while growing the crystal. In the CZ method, since heating is performed from the side of a crucible, natural convection occurs in the melt. Further, since rotation number of the crystal and rotation number of the crucible are controlled in order to obtain a silicon single crystal of high quality, forced convection is also generated in the silicon melt and a complicated flow is formed. It is said that a method of applying a static magnetic field to the silicon melt is effective in control of the convection in such a melt (refer to "Magneticfield-applied CZ Silicon Crystal Growth and Characteristics thereof", Integrated Circuit Symposium, 1980. 11).

Such a method is widely known as a horizontal magnetic field type HMCZ method, and the production has been performed by using a lengthwise (vertical) magnetic field component at the surface of the melt with a magnitude of 0 or in an extremely small ratio (about 0.025) with respect to the lateral (horizontal) magnetic field component. This is because, in the HMCZ method, it is an important object to suppress the convection of the melt along the vertical direction to facilitate the growth of a single crystal.

By the way, in the production of recent highly integrated semiconductor devices, interstitial oxygen atoms introduced into silicon wafers that serve as a substrate are utilized in various ways. For example, they are used for the improvement in mechanical strength for bearing the thermal stress in the device fabrication process, and they are used as gettering sites for heavy metal impurities as fine defects (Bulk Micro Defects) formed by precipitation of the interstitial oxygen atoms excessively introduced in the device fabrication process. Therefore, in recent high quality silicon single crystals, control and uniformity of the interstitial oxygen concentration are important.

However, in such a pulling method as mentioned above based on the HMCZ method, the convection of the silicon melt in a quartz crucible is suppressed, and therefore the crystal production is easy. However, minute variation in the interstitial oxygen concentration as crystal quality may be generated to degrade the production yield of single crystals. That is, there is generated variation in the interstitial oxygen concentration along the crystal growth axis direction with a length of about several hundreds microns to about several millimeters and an amplitude of about 1 ppma (JEIDA), and silicon wafers made from this portion would have markedly degraded oxygen concentration distribution for the planar direction of the wafers. Since this portion produces failure products, it reduces the yield, degrades the productivity and increases the cost in the production of silicon single crystals.

As for the magnetic field distribution in the HMCZ method, for example, Japanese Patent Laid-open Publication (Kokai) No. 62-256788 discloses that the magnetic field distribution is controlled so that it should conform to the curvature of the bottom or wall of a quartz crucible along the circumferential direction of the crucible. However, it discloses only the effect of prolonging the lifetime of heaters to be used, and the quality of the produced single crystals cannot be improved. Further, Japanese Patent Laid-open Publication No. 9-188590 discloses a method for improving quality of silicon single crystals based on the HMCZ method. However, this method cannot necessarily provide sufficient effect.

SUMMARY OF THE INVENTION

Therefore, the present invention was accomplished in view of such conventional problems, and its major object is to provide a method and an apparatus for producing a silicon single crystal, which can grow a silicon single crystal ingot having highly uniform interstitial oxygen concentration along the growth axis direction of the grown single crystal with high productivity and high yield by the CZ method wherein a horizontal magnetic field is applied.

According to the first aspect of the present invention for achieving the aforementioned object, there is provided a method for producing a silicon single crystal by growing a single crystal ingot while a magnetic field perpendicular to a crystal growth axis is applied to a silicon melt contained in a quartz crucible during pulling of the single crystal from the melt contained in the quartz crucible, wherein the crystal growth is performed so that one of a low temperature region and a high temperature region generated at a surface of the silicon melt contained in the crucible should always cover a solid-liquid interface of the crystal growth.

If the crystal growth is performed so that one of a low temperature region and a high temperature region generated at a surface of the silicon melt should always cover a solid-liquid interface of the crystal growth as described above, variation in the oxygen concentration along the growth direction generated during the crystal growth can be suppressed, and uniformity of the interstitial oxygen concentration within a plane along the radial direction of the crystal can be improved.

In the above method, the crystal growth can be performed so that one of the low temperature region and the high temperature region should always locate at the center of the surface of the silicon melt.

By this characteristic, the crystal growth becomes easy. In addition, the low temperature region or the high temperature region can cover a solid-liquid interface, and this state can be maintained stably for a long period of time. Therefore, the variation in the interstitial oxygen concentration along the direction of the crystal growth can further be suppressed, and improvements of productivity and yield of single crystals with highly uniform interstitial oxygen concentration can be realized.

Further, in the above method, the low temperature region or the high temperature region of the melt surface can be detected by a radiation pyrometer, thermocouple or CCD camera.

If the temperature distribution of the melt surface is measured with a radiation pyrometer, thermocouple or CCD camera to detect and confirm the position and size of the high temperature region or the low temperature region as described above, the high temperature region or the low temperature region can be easily detected and always located at the center of the melt surface. This is effective for suppressing the variation in the temperature distribution, and thus uniformity of the interstitial oxygen concentration along the single crystal growth direction can be improved.

Further, in the aforementioned method for producing a silicon single crystal, it is desirable that the monitoring of the temperature distribution of the melt surface with the aforementioned radiation pyrometer, thermocouple or CCD camera should be always performed continuously during the crystal growth, and thereby the crystal growth is performed so that one of the low temperature region and the high temperature region generated at the melt surface should always cover the solid-liquid interface of the crystal growth.

Further, the present invention provides the aforementioned method for producing a silicon single crystal, wherein crystal growth experiments can be preliminarily performed to obtain such conditions that one of the low temperature region and the high temperature region generated at the melt surface should always cover the solid-liquid interface of the crystal growth, and the conditions can be applied to the crystal growth operation based on the monitoring of the temperature distribution of the melt surface with the aforementioned radiation pyrometer, thermocouple or CCD camera.

The conditions that enable one of the low temperature region and the high temperature region generated at the melt surface to always cover the solid-liquid interface of the crystal growth consist of factors including the temperature distribution in the melt, direction, position and velocity of the convection of the melt, rotation speed of the growing crystal, rotation speed of the crucible, temperature distribution in the furnace, amount, flow rate and nozzle position of atmospheric gas in the furnace, intensity and magnetic field center position of the horizontal magnetic field, characteristics of the furnace and so forth, and these factors influence on one another in a complicated manner. Therefore, the factors must be narrowed down by preliminarily performing crystal growth experiments. Then, in an actual operation, the selected factors can be controlled by feeding back the detection results obtained by the radiation pyrometer, thermocouple or CCD camera to stabilize the temperature distribution of the melt surface, and this state can be maintained during the crystal growth to suppress the variation in the interstitial oxygen concentration in the growing crystal.

The present invention further provides a silicon single crystal produced by the aforementioned method, which is a silicon single crystal that has an-extremely high uniformity of the interstitial oxygen concentration in the crystal along the growth direction.

The present invention still further provides a silicon single crystal wafer obtained from a silicon single crystal produced by the aforementioned method, which is a silicon single crystal wafer having an extremely reduced minute variation in the interstitial oxygen concentration distribution along the radial direction in a plane.

Further, the present invention also provides a silicon single crystal produced by the horizontal magnetic field type Czochralski method, wherein variation magnitude of the interstitial oxygen concentration is 0.5 ppma or less in an arbitrary section with a length of 40 mm along the crystal growth axis direction of the single crystal pulled from a silicon melt contained in a quartz crucible. This crystal is a silicon single crystal having an extremely reduced minute variation in the interstitial oxygen concentration distribution along the crystal growth axis direction.

Further, as the second aspect of the present invention for achieving the aforementioned object, there is provided a method for producing a silicon single crystal by growing a single crystal ingot while a magnetic field perpendicular to a crystal growth axis is applied to a silicon melt contained in a quartz crucible during pulling of the single crystal from the melt contained in a quartz crucible, wherein a ratio of vertical magnetic field component to horizontal magnetic field component for magnetic field strength at the crystal center of the surface of the silicon melt contained in the quartz crucible is 0.3 or more and 0.5 or less.

If the ratio of the vertical magnetic field component to the horizontal magnetic field component for the magnetic field strength at the crystal center of the surface of the silicon melt contained in a quartz crucible is 0.3 or more and 0.5 or less as described above, the vertical magnetic field component is increased and thus the lines of magnetic force are curved as for the vertical direction. Therefore, the whole convection of the melt can be suppressed, and the convection horizontally flowing at the melt surface is suppressed at the same time. This makes it possible to suppress the variation in the interstitial oxygen concentration along the direction of the crystal growth axis, and productivity and yield of high quality silicon single crystal can be improved.

In the aforementioned method, a position of a magnetic field generation apparatus and/or a position of the quartz crucible can be adjusted so that the ratio of the vertical magnetic field component to the horizontal magnetic field component for the magnetic field strength at the silicon melt surface during the single crystal growth should be within the range defined above.

By the above characteristic, it becomes possible to stably maintain the aforementioned magnetic field strength ratio at a desired level within the range of 0.3 or more and 0.5 or less for a long period of time, and thus it becomes possible to suppress the convection horizontally flowing at the melt surface. Therefore, the variation in the interstitial oxygen concentration along the crystal growth axis direction can be suppressed.

Further, in this case, a magnetic field strength adjusting member may be provided around a magnetic field generation apparatus or a single crystal growing apparatus, and the position thereof may be adjusted so that the magnetic field strength ratio at the silicon melt surface during the single crystal growth should be within the aforementioned range.

For example, even when the ratio of the vertical magnetic field component to the horizontal magnetic field component for the magnetic field strength is out of the range defined above because the positions of the magnetic field generation apparatus and the single crystal growing apparatus (quartz crucible) are limited by each other as relative positional relationship, the magnetic field strength ratio at the melt surface can be controlled within the range defined above by providing the magnetic field strength adjusting member around the magnetic field generation apparatus or the single crystal growing apparatus and adjusting the position thereof as described above. Thus, uniformity of the interstitial oxygen concentration of a growing crystal can be improved.

The present invention also provides an apparatus for producing a silicon single crystal by pulling a single crystal from silicon melt contained in a quartz crucible, which is provided with a magnetic field generation apparatus for applying a magnetic field perpendicular to the crystal growth axis to the melt in the quartz crucible, wherein a member for controlling a magnetic field strength ratio is provided around the magnetic field generation apparatus or the apparatus for growing a single crystal.

In an apparatus for producing a silicon single crystal provided with a magnetic field generation apparatus for applying a horizontal magnetic field, if a member for controlling a magnetic field strength ratio is provided around the magnetic field generation apparatus or the single crystal growing apparatus as described above, it becomes possible to obtain the ratio at the melt surface of the vertical magnetic field component/the horizontal magnetic field component for the magnetic field strength at a desired level. Thus, the apparatus can be an apparatus that can control the convection horizontally flowing at the melt surface to suppress the fluctuation in the interstitial oxygen concentration along the crystal growth axis direction, produce silicon single crystal of high quality with good yield, and improve the productivity and cost at the same time.

Because the-method and apparatus of the present invention for producing a silicon single crystal by the horizontal magnetic field applying Czochralski method can suppress the fluctuation in the interstitial oxygen concentration along the growth axis direction in a growing crystal and markedly reduce the minute variation in the interstitial oxygen concentration in a plane of wafer, they can industrially produce silicon single crystals of high quality with high yield at low cost.

BRIEF DESCRIPTION OF THE DRAWINGS

FIG. 3 shows variation in the interstitial oxygen concentration in a silicon single crystal along the growth axis direction (measured values for a position at a distance of 10 mm from the circumference of the crystal) for the cases where:
(a) the crystal has grown above a low temperature region of the melt and the low temperature region occasionally shifted toward outside from the position under the crystal,
(b) the crystal has grown exclusively above a low temperature region of the melt,
(c) the crystal has grown above a high temperature region of the melt and a low temperature region occasionally passed under the crystal, and
(d) the crystal has grown exclusively above a high temperature region of the melt.

FIG. 4 shows variation in the interstitial oxygen concentration along the growth axis direction in the silicon single crystal of Test 1 (measured values for a position at a distance of 10 mm from the circumference of the crystal) for:
(a) a straight body at 10 cm inner side from the shoulder of the single crystal ingot,
(b) the center of the straight body of the single crystal ingot [the same as that of FIG. 3(b)], and
(c) a straight body at 5 cm inner side from the tail of the single crystal ingot.

FIG. 5 shows horizontal plane magnetic field strength distribution in a silicon single crystal production apparatus by the HMCZ method.

DETAILED DESCRIPTION OF THE INVENTION

Hereafter, specific embodiments of the present invention will be explained. However, the present invention is not limited by these.

As for the growth of a silicon single crystal by the CZ method in which a horizontal magnetic field is applied, if a crystal was pulled by the conventional HMCZ method, uniformity of the interstitial oxygen concentration along the single crystal growth axis direction might be insufficient. The inventors of the present invention studied to follow out the cause of that phenomenon, and found that a low temperature region and a high temperature region generated at the melt surface closely related to that phenomenon. Further, they also found that it could be improved by suppressing the convection horizontally flowing at the surface of the silicon melt (also referred to as "melt" or "molten metal" hereafter). Then, they extensively investigated the conditions of the high temperature region and the low temperature region or the convection at the surface of the melt in detail, and thus accomplished the present invention.

First, concerning the first embodiment of the present invention, the temperature distribution of the melt in the HMCZ method was determined, and the convection was observed.

Figure 2:
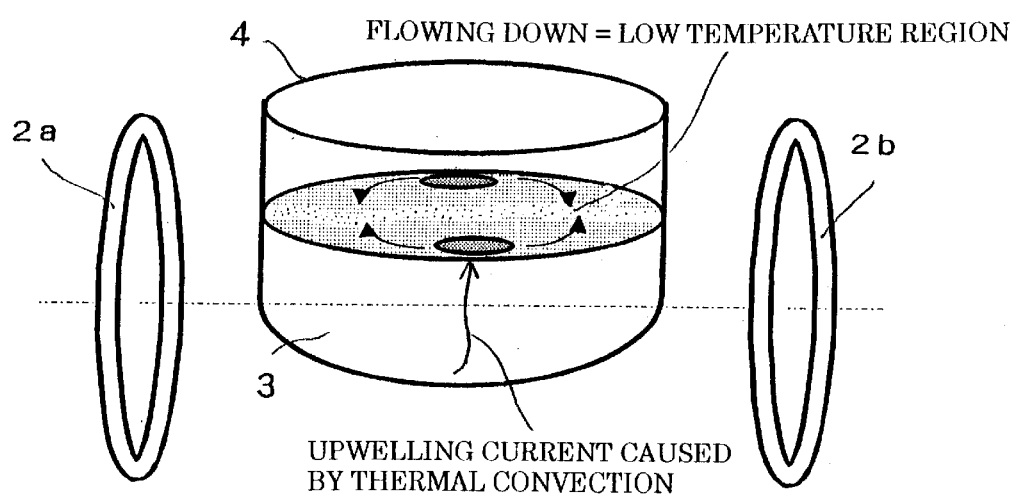
FIG. 2 is an explanatory view showing exemplary convection of silicon melt in the HMCZ method.

According to the investigation and experiments of the inventors of the present invention, it was found that specific temperature distribution was generated at the melt surface in the HMCZ method, based on measurement of the melt surface temperature and observation of surface convection. Further, convection of the melt that apparently corresponded to the temperature distribution was also observed. In this convection, as shown in FIG. 2, for example, upwelling currents are generated at two approximately opposed spots near the circumference of the quartz crucible 4, and the melt 3 flows down around the center line of the crucible. In this case, regions of the melt surface corresponding to the upwelling currents constitute the high temperature region, and the region where the melt flows down constitutes the low temperature region.

Figure 1:
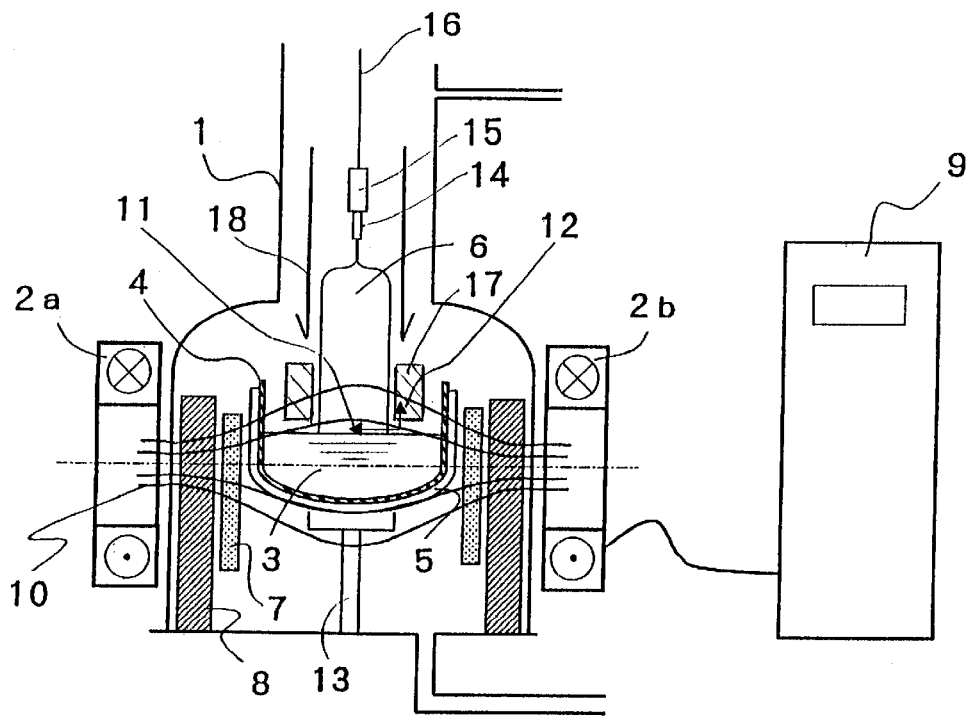
FIG. 1 is a schematic explanatory view of an apparatus for producing a silicon single crystal by the HMCZ method according to the first embodiment of the present invention.

In many cases, as seen in the magnetic field strength distribution shown in FIGS. 1 and 5, the regions where upwelling currents are generated correspond to the positions most separated from the electromagnet coils 2a and 2b within the area near the circumference of the crucible. It is presumed that this is because the magnetic field strength becomes weak at positions distant from electromagnet coils to reduce the effect for suppressing the convection, and thus the upwelling currents generated in such positions as shown in FIG. 2 constitute the cause of the aforementioned characteristic convection of the melt.

The inventors of the present invention conducted investigation and experiments as for the relationship between the convection of the melt and the interstitial oxygen concentration in the crystal as described above. As a result, it was found that, when the crystal growth was performed from the flowing down region of the melt, which is the low temperature region, the interstitial oxygen concentration in the crystal increased. Although the cause of this phenomenon is undetermined, it is presumed that the facts that the solid solubility of oxygen for the melt increases as temperature becomes lower, vaporization of oxygen from the melt increases as temperature becomes higher, and so forth constitute the cause of the phenomenon.

A problem resides in that the temperature distribution is not always constant and the position of flowing down at the low temperature region may change depending on change of the conditions for the pulling of crystal.

For example, even within the growth of one piece of crystal, the temperature distribution of the melt may change with change of the melt amount, distribution of heating of the melt relative location of the melt with respect to the magnetic field or the like. Therefore, for example, if a low temperature region passes under a crystal that has been grown above a high temperature region until then, the introduced interstitial oxygen concentration increases only in that portion formed then, which causes the problem of the variation in the oxygen concentration. Such deviation of the temperature distribution in the melt used in the HMCZ method is an inevitable problem of the HMCZ method, and it is considered to be very difficult to eliminate it.

However, the inventors of the present invention conceived that such temperature deviation might conversely be utilized, that is, if the temperature deviation could be stably maintained, the variation in the oxygen concentration could be suppressed. Thus, they continued investigation and experiments. As a result, it was found that the fluctuation in the interstitial oxygen concentration generated during the crystal growth could be suppressed by performing the crystal growth according to the first embodiment of the present invention, that is, performing the crystal growth under a condition that, among a high temperature region and a low temperature region in the temperature distribution generated at the melt surface in the HMCZ method, one of the high temperature region and the low temperature region always locates under the growing crystal. The remaining problem is how to maintain the temperature distribution of the melt, in other wards, the pattern of the convection, within a certain range.

For this purpose, it is extremely effective to detect the high temperature region and the low temperature region of the melt surface by a radiation pyrometer, thermocouple or CCD camera, and it is desirable that the temperature distribution of the melt surface should be always continuously monitored during the crystal growth. The temperature detection by a CCD camera used herein comprises picturizing two-dimensional distribution of the radiation energy emitted from the melt surface, and converting signal charges into temperature data to obtain two-dimensional temperature distribution of the melt surface.

Further, crystal growth experiments are performed beforehand to determine such conditions that, among a high temperature region and a low temperature region generated at the melt surface, one of them should always cover the solid-liquid interface of the crystal growth, and the conditions are applied to a crystal growth operation.

The conditions that enable one of the low temperature region and the high temperature region generated at the melt surface to always cover the solid-liquid interface of the crystal growth consist of factors including the temperature distribution in the melt, direction, position and velocity of the convection of the melt, rotation speed of the growing crystal, rotation speed of the crucible, temperature distribution in the furnace, amount, flow rate and nozzle position of atmospheric gas in the furnace, intensity and magnetic field center position of the horizontal magnetic field, characteristics of the furnace and so forth, and these factors influence on one another in a complicated manner. Therefore, the factors must be narrowed down by preliminarily performing crystal growth experiments. Then, in an actual crystal growth operation, a crystal can be pulled while controlling the selected factors. In this case, it is preferred that the selected factors are controlled by feeding back the detection results obtained by the radiation pyrometer, thermocouple or CCD camera to stabilize the temperature distribution of the melt surface and maintain this state during the crystal growth, so that the variation in the interstitial oxygen concentration in the growing crystal should be suppressed.

As for specific example of the narrowed down factors among the aforementioned factors, it has become clear that it becomes possible to always locate a low temperature region at the melt surface under a growing crystal by maintaining the rotation speed of crucible within a certain range under a condition that the temperature distribution in the furnace and the atmospheric gas (argon) flow show good symmetry with respect to the growing crystal axis. Because this rotation speed of the crucible may vary depending on the crystal growth conditions, it must be experimentally obtained. When the rotation speed of the crucible becomes faster, the rotation causes a repeating oscillation phenomenon where the temperature distribution of the melt surface is rotated along the rotation direction of the crucible and it turns back to the original position at a certain position, and thus the temperature distribution undesirably suffer from periodic turbulence. When a crucible rotation speed is low, low temperature regions are likely to undesirably move parallel even when they exist near the center line of the crucible. Although the cause of this parallel displacement is not clear, it is considered that slight axial asymmetry of the conditions in the furnace is reflected.

Further, since there is a tendency that a more stable flowing down region is formed at the center as the upwelling currents near the crucible wall become stronger, it is also effective for stabilizing the temperature distribution to use a larger curve of the magnetic field components to weaken the magnetic field strength as approaching to the position where the magnetic field perpendicularly crosses with the coils. Since this value may also vary depending on the distribution of heating, temperature distribution due to the structure in the furnace, position of the magnetic field center with respect to the depth of the melt and so forth, it must also be experientially obtained.

As another means, it is expected to use extremely strong magnetic field strength. However, it is not suitable for industrial use because of the problems of increased cost of the apparatus, leakage of magnetic field and so forth.

Conversely, in order to always locate a high temperature region under a growing crystal, axial asymmetric temperature distribution in the furnace, atmospheric gas flow or the like can be used. These produce difference of the strength of upwelling currents near the crucible wall, and as a result, the flowing down region can be deviated from the center axis of electromagnet coils. Specifically, as relatively easy methods for altering the temperature distribution in the furnace, a heat insulating cylinder disposed over the melt surface can be used in a biased arrangement, or gas flow-guide cylinder for the atmospheric gas can be disposed in a biased arrangement to provide an axial asymmetric gas flow.

The second embodiment of the present invention is a method for producing a silicon single crystal by growing a single crystal ingot while a magnetic field perpendicular to a crystal growth axis is applied to a silicon melt contained in a quartz crucible during pulling the single crystal from the silicon melt contained in the quartz crucible, wherein the single crystal growth is performed while controlling a magnetic field strength ratio of vertical magnetic field component to horizontal magnetic field component as for the magnetic field strength at the crystal center of silicon melt surface contained in the quartz crucible to be within the range of 0.3 or more and 0.5 or less, and maintaining it.

If the vertical magnetic field component is increased so that the magnetic field strength ratio of the vertical magnetic field component to the horizontal magnetic field component (vertical magnetic field component/horizontal magnetic field component) for the magnetic field strength at the crystal center of the silicon melt surface in the quartz crucible should be 0.3 or more and 0.5 or less as described above, the lines of magnetic force of the horizontal direction are curved as for the vertical direction. Thus, the whole convection of the melt can be suppressed, and the convection horizontally flowing at the crystal center of the melt surface can be suppressed at the same time. This makes it possible to reduce the variation in the interstitial oxygen concentration along the direction of the crystal growth axis, and suppress the fluctuation in the interstitial oxygen concentration in a plane of the crystal along the radial direction to improve the uniformity.

In this case, if the ratio exceeds 0.5, the fluctuation in the interstitial oxygen concentration in a plane of a silicon wafer sliced from the grown silicon single crystal along the radial direction is likely to become large, and hence the yield is likely to be reduced. Therefore, it is preferably controlled to be 0.5 or less. On the other hand, in order to effectively control the horizontal convection, it is controlled to be 0.3 or more.

In order to control the magnetic field strength ratio at the silicon melt surface to be within the range of 0.3 or more and 0.5 or less, the position of the magnetic field generation apparatus and/or the position of the quartz crucible can be controlled. In this case, either the crucible or the magnetic field generation apparatus may be moved.

When the aforementioned magnetic field strength distribution (vertical component/horizontal component=0.3 to 0.5) cannot be attained because of a limitation concerning the relative positional relationship of the single crystal growing apparatus and the magnetic field generation apparatus, of which positions are limited by each other, a magnetic field strength adjusting member, i.e., a member of high magnetic permeability consisting of a ferromagnetic or paramagnetic material, can be provided around the single crystal growing apparatus or the magnetic field generation apparatus. The magnetic fluxes are preferentially gathered in the magnetic material and hence magnetic field distribution of the magnetic field will be changed. Therefore, predetermined magnetic field strength distribution can be obtained, and thus silicon single crystals of high quality can be produced.

Specifically, for example, when a silicon single crystal having a diameter of 200 mm was grown by using a quartz crucible having a diameter of 24 inches (600 mm), a magnetic field strength adjusting member made of iron having a diameter of 100 cm, width of 5 cm and thickness of 0.4 cm was provided around the single crystal growing apparatus. This could shift the magnetic field component strength ratio at the silicon melt surface in the single crystal growing apparatus from 0.26, which gave significant fluctuation in the interstitial oxygen concentration, to 0.4, which exhibited sufficient quality improving effect. Therefore, even when a magnetic field component strength ratio cannot be selected within the above-defined range because of interference between the single crystal growing apparatus and the magnetic field generation apparatus or the like, the magnetic field distribution can easily be changed by the method of suitably providing a magnetic field strength adjusting member outside or inside the magnetic field generation apparatus.

Figure 6:
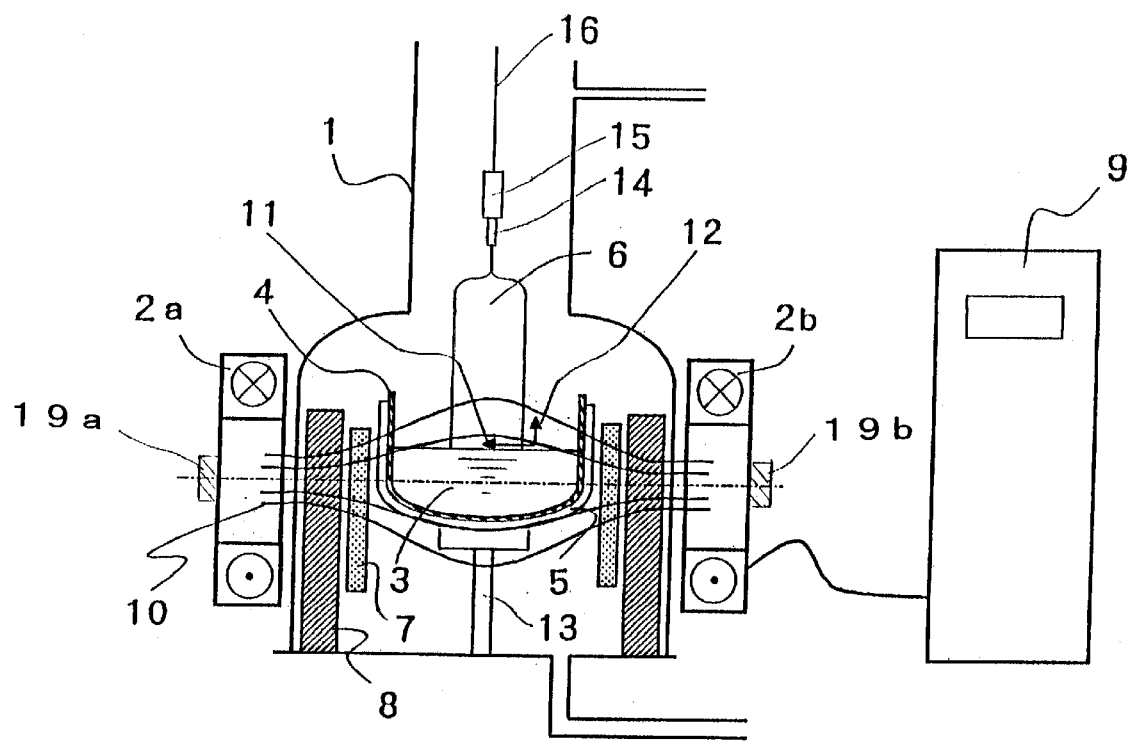
FIG. 6 is a schematic explanatory view of an example of an apparatus for producing a silicon single crystal by the HMCZ method according to the second embodiment of the present invention.

Now, exemplary structures of the apparatus for producing a single crystal used for the present invention, which is based on the CZ method applying a horizontal magnetic field, will be explained by referring to FIGS. 1 and 6. While FIG. 1 shows an exemplary structure of a single crystal production apparatus concerning the first embodiment of the present invention and FIG. 6 shows an exemplary structure of a single crystal production apparatus concerning the second embodiment of the present invention, the basic structure as a single crystal production apparatus is common to the both apparatuses.

As for the aforementioned basic structure, as shown in FIG. 1, the apparatus for producing a silicon single crystal is constituted as an apparatus for growing a single crystal by a chamber 1, a quartz crucible 4 provided in the chamber 1, graphite heaters 7 of resistance heating type disposed around the quartz crucible 4, a crucible rotating shaft 13 for rotating the quartz crucible 4 and a rotation mechanism therefor (not shown), a seed holder 15 for holding a silicon seed crystal 14, a wire 16 for pulling the seed holder, and a winding mechanism (not shown) for rotating and winding the wire. The quartz crucible 4 accommodates silicon melt (molten metal) 3, and a graphite susceptor (crucible) 5 is provided outside the crucible. Further, heat insulating materials 8 are also provided around the heaters 7. Further, electromagnets 2a and 2b as an apparatus for generating a horizontal magnetic field are provided outside the chamber 1 of the apparatus for growing a single crystal in the horizontal direction in a bilaterally symmetric manner with respect to the rotation axis 13 of the crucible, and magnetic field strength is controlled by a control panel 9 for the magnetic field generation apparatus. Lines of magnetic force 10 generated in this case consist of the horizontal magnetic field component 11 and the vertical magnetic field component 12.

In addition, as examples of additional equipment for growing a crystal according to the first embodiment of the present invention while one of a high temperature region and a low temperature region generated at the silicon melt surface in a crucible always covers the solid-liquid interface of the crystal growth, there can be mentioned, for example, a heat insulating cylinder 17 disposed around the growing crystal for controlling the temperature distribution in the furnace, and an atmospheric gas flow-guide cylinder 18 disposed around the growing crystal for controlling the blowing manner of the atmospheric gas in the furnace for the crystal surface as shown in FIG. 1.

Hereafter, the method for growing a single crystal by the aforementioned apparatus shown in FIG. 1 according to the first embodiment of the present invention for pulling a single crystal based on the CZ method in which a horizontal magnetic field is applied will be explained.

First, the position of the magnetic field center of the electromagnets 2a and 2b are placed at a predetermined position by an elevator mechanism not shown in the figure. Then, a silicon polycrystal raw material of high purity is melted in the quartz crucible 4 by heating it to a temperature higher than the melting point thereof (about 1420° C.). Then, a horizontal magnetic field is applied, and a tip end of the seed crystal 14 is brought into contact with, or immersed into the surface of the melt 3 at its approximately center portion by reeling out the wire 16. Then, the crucible rotating shaft 13 is rotated in an optional direction, and the seed crystal 14 is pulled upwardly by winding up the wire 16 with rotating the wire to start the growing of a silicon single crystal 6. Thereafter, a single crystal ingot in an approximately columnar shape can be obtained by appropriately controlling the pulling rate and temperature.

On the other hand, the exemplary apparatus for producing a single crystal used in the second embodiment of the present invention for obtaining a desired magnetic field component ratio, which is shown in FIG. 6, comprises elevator means not shown in the figure for both of the magnetic field generation apparatus (electromagnets for horizontal magnetic field 2a and 2b) and the quartz crucible 4, because it is necessary to control the relative positional relation between the both so that the magnetic field strength ratio at the silicon melt surface during the single crystal growth should be within the predetermined range.

Further, magnetic field strength adjusting members 19a and 19b are also disposed for adjusting the magnetic field strength ratio around the magnetic field generation apparatus (electromagnets for horizontal magnetic field 2a and 2b) or the single crystal growing apparatus in a manner that their disposition locations can be adjusted.

Hereafter, the method for growing a single crystal by the aforementioned single crystal. production apparatus according to the second embodiment of the present invention, which is shown in FIG. 6, based on the CZ method in which a horizontal magnetic field is applied will be explained.

First, a silicon polycrystal raw material of high purity is melted in the quartz crucible 4 by heating it to a temperature higher than the melting point thereof (about 1420° C.). Then, the positions of the electromagnets 2a and 2b and/or the position of the quartz crucible 4 are adjusted by elevator means for the magnetic field generation apparatus and the crucible not shown in the figure, so that the magnetic field strength ratio of the melt surface should be the predetermined level.

Then, a horizontal magnetic field is applied, and a tip end of the seed crystal 14 is brought into contact with, or immersed into the surface of the melt 3 at its approximately center portion by reeling out the wire 16. Then, the crucible rotating shaft 13 is rotated in an optional direction, and the seed crystal 14 is pulled upwardly by winding up the wire 16 with rotating the wire to start the growing of a single crystal 6. Thereafter, a single crystal ingot in an approximately columnar shape can be obtained by appropriately controlling the pulling rate and temperature.

As described above, if a silicon single crystal is produced by the production method and the production apparatus concerning the first embodiment or the second embodiment of the present invention with suitable conditions for the CZ method according to the present invention in which a horizontal magnetic field is applied, the variation in the interstitial oxygen concentration in a growing crystal along the direction of crystal growth axis can be made extremely small, and uniformity of the interstitial oxygen concentration in a plane along the wafer radial direction can be made extremely high. Thus, improvements of productivity and yield of silicon single crystals can be realized, and cost can be significantly improved.

Hereafter, the present invention will be specifically explained with reference to the following examples and so forth. However, the present invention is not limited by them.

First, concerning the first embodiment, exemplary factors for improving the temperature distribution were selected, and the effect thereof was confirmed.

(Test 1)

Such a silicon single crystal production apparatus based on the HMCZ method as shown in FIG. 1 was used. 150 kg of polycrystal silicon was charged into a quartz crucible having a diameter of 24 inches, and the polycrystal silicon was melted by graphite heaters of resistance heating type. The output was controlled from a control panel of the magnetic field generation apparatus so that a magnetic field of 4000 Gausses should be applied to the silicon melt formed in the quartz crucible along an approximately horizontal direction. A seed crystal having a plane orientation of {100} was immersed in the silicon melt, and a silicon single crystal having a diameter of 200 mm was grown after necking. In this operation, in order to fix a low temperature region approximately at the center for the full length of the crystal growth as for the temperature distribution of the silicon melt surface, a crucible rotation speed of 1.0 rpm was used, and gas flow-guide cylinder for an atmospheric gas (argon gas) was provided around the growing crystal so that the crystal surface should be uniformly blown with the gas. Further, the temperature distribution of the melt surface was continuously monitored with a radiation pyrometer, thermocouple or CCD camera.

The single crystal ingot pulled with the above conditions was evaluated for uniformity of the concentration of interstitial oxygen introduced into the crystal. A wafer having a thickness of 2 mm and a {001} plane parallel to the growth axis at the center portion of the crystal was sliced from the silicon single crystal pulled, and polished for the both sides. The interstitial oxygen concentration was measured for the center of the crystal straight body at intervals of 300 $\mu$m for a length of 40 mm by using $\mu$-FTIR (Fourier Transform Infrared Spectroscopy). The size of the measurement spot was growth direction×radial direction=100 $\mu$m×200 $\mu$m=0.02 mm². The measurement was performed along the growth direction for a position at a distance of 10 mm from the outer periphery of the crystal. The reason why the measurement was performed for the peripheral portion was that higher sensitivity for the oxygen concentration variation in the melt could be obtained.

The results of the measurement of the interstitial oxygen concentration are shown in FIG. 3(b).

From the results shown in FIG. 3(b), it can be seen that if the crystal was uniformly blown with the atmospheric gas and the crucible rotation was increased to around 1.0 rpm, the low temperature region of the melt surface stably existed around the center of the melt, and thus the variation,in the interstitial oxygen concentration was markedly small. FIG. 4 shows the results of the measurement for (a) straight body at 10 cm inner side from the shoulder of the single crystal ingot, (b) the center of straight body [the same as that of FIG. 3(b)], and (c) straight body at 5 cm inner side from the tail of the single crystal ingot. From the results shown in FIG. 4, it can be seen that uniformity of the interstitial oxygen concentration was improved for the full length of the crystal.

(Test 2)

A crystal was pulled under the same crystal growth conditions as the aforementioned Test 1 except that a crucible rotation speed of 0.3 rpm was used.

The results are shown in FIG. 3(a).

As shown in FIG. 3(a), it can be seen that, if the crucible rotation speed was low, a portion of low oxygen concentration sometimes occurred, and the fluctuation thereof became large, even though the crystal surface was uniformly blown with the atmospheric gas. This was considered to be caused because, while the low temperature region usually existed at the center, a movement of the melt was caused, in which the low temperature region periodically moved from the position under the crystal toward the outside and returned to the original position.

(Test 3)

A crystal was pulled under the same crystal growth conditions as the aforementioned Test 1 except that a notch was provided at a part of atmospheric gas flow-guide cylinder on the gas blowing side.

The results are shown in FIG. 3(d). In this case, the crystal was unevenly blown with the atmospheric gas and the temperature distribution in the furnace was biased. However, a high temperature region was generated under the crystal, and when the crucible rotation speed was increased to about 1.0 rpm, the high temperature region stably existed around the center of the melt. Thus, the variation in the interstitial oxygen concentration became very small.

(Test 4)

A crystal was pulled under the same crystal growth conditions as the aforementioned Test 1 except that a crucible rotation speed of 0.3 rpm was used and a notch was provided at a part of atmospheric gas flow-guide cylinder on the gas blowing side.

The results are shown in FIG. 3(c). In this experiments of which results are shown in FIG. 3(c), a portion having a high oxygen concentration sometimes occurred contrary to Test 2 (FIG. 3(a)) This phenomenon is considered to be caused because of the following reason. Usually, a high temperature region exists at the center, and a low temperature region deviates from the center and exists in a peripheral portion of the crucible. However, the use of the axial asymmetric atmospheric gas flow produced a movement of the melt, in which the low temperature region occasionally moved toward the center of the melt and passed a position under the crystal, and then it returned to the original position, and this movement caused the above phenomenon.

As described above, if a silicon single crystal is produced by the production method and apparatus explained above with suitable conditions for the CZ method according to the present invention in which a horizontal magnetic field is applied, so that the crystal growth should be performed in a state that one of a low temperature region or a high temperature region of the melt surface in the crucible-should always exist at a position corresponding to the solid-liquid interface of the growing crystal, preferably in a state that one of the region locates at the center of the melt surface, the fluctuation in the interstitial oxygen concentration in the growing crystal along the axial direction can be made extremely small, and uniformity of the oxygen concentration in a plane of a wafer can be made extremely high. Thus, improvements of productivity and yield of silicon single crystals can be realized.

Further, in the conventional HMCZ method, although the silicon melt convection in a quartz crucible is suppressed, variation in the convection occasionally generated, and thereby the minute variation in the interstitial oxygen concentration along the crystal growth direction is generated. The oxygen concentration distribution in a plane of a wafer fabricated from this crystal portion is markedly degraded, and thus yield of the products is reduced. In order to obtain a silicon wafer having good oxygen concentration distribution in a plane, a crystal may be grown with the minute variation in the oxygen concentration of 0.5 ppma or less for an arbitrary section of 40 mm along the crystal growth direction, because the height of the crystal growth interface is about 20 to 30 mm, when the oxygen concentration of the crystal growth interface is uniform.

Then, the following examples and so forth were performed concerning the ratio of the vertical magnetic field component and the horizontal magnetic field component for the second embodiment of the present invention.

EXAMPLE 1

Such a silicon single crystal production apparatus based on the HMCZ method as shown in FIG. 1 was used. 150 kg of polycrystal silicon was charged into a quartz crucible having a diameter of 24 inches (600 mm), and the polycrystal silicon was melted by graphite heaters of resistance heating type. The output was controlled from a control panel of the magnetic field generation apparatus so that a magnetic field of 4000 Gausses should be applied to the silicon melt formed in the quartz crucible along an approximately horizontal direction. A seed crystal having a plane orientation of {100} was immersed in the silicon melt, and a silicon single crystal having a diameter of 200 mm was grown after necking.

In this operation, the magnetic field strength ratio of vertical magnetic field component/horizontal magnetic field component at the crystal center at the silicon melt surface was 0.26. Further, this ratio was changed to 0.34, 0.40, 0.44 or 0.52 to produce five silicon single crystals with five kinds of levels of the ratio in total.

The single crystal ingots pulled with the above conditions were evaluated for uniformity of the concentration of interstitial oxygen introduced into the crystals (ppma, JEIDA: Japan Electronic Industry Development Association Standard). A wafer having a thickness of 2 mm and a {001} plane parallel to the growth axis at the center portion of the crystal was sliced from each pulled silicon single crystal and chemically polished for the both sides to produce a double-side polished wafer. The interstitial oxygen concentration was measured at intervals of 300 $\mu$m for a total length of 45 mm by using $\mu$-FTIR (Fourier Transform Infrared Spectroscopy). The size of the measurement spot was 100 $\mu$m×200 $\mu$m (growth direction×radial direction).

Figure 7:
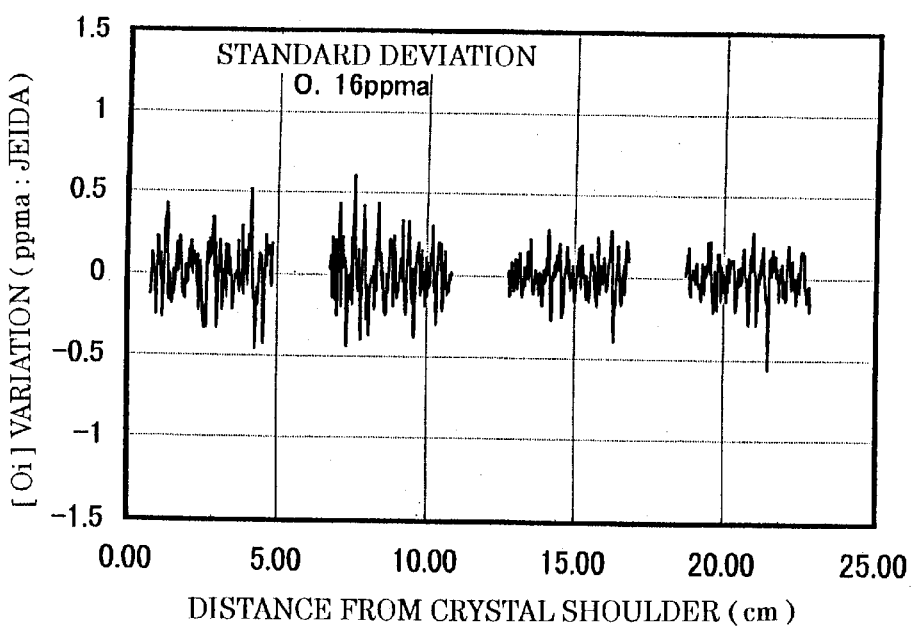
FIG. 7 shows fluctuation in the interstitial oxygen concentration along the growth axis direction of a silicon single crystal produced with a condition of a vertical magnetic field component/horizontal magnetic field component ratio for horizontal magnetic field strength of 0.40.
Figure 8:
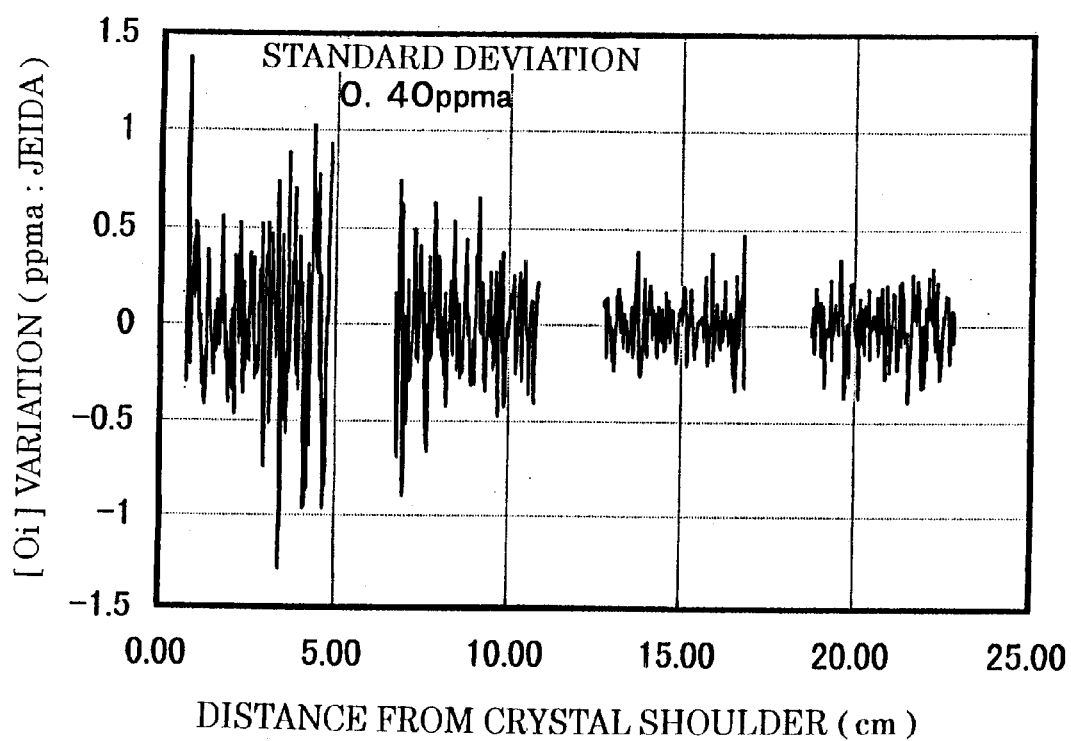
FIG. 8 shows fluctuation in the interstitial oxygen concentration along the growth axis direction of a silicon single crystal produced with a condition of a vertical magnetic field component/horizontal magnetic field component ratio for horizontal magnetic field strength of 0.26.

The results of the measurement are shown in FIGS. 7 and 8.

FIG. 7 shows interstitial oxygen concentration profiles along the growth axis direction for portions at various distances (cm) from the shoulder of silicon single crystal ingot for a silicon single crystal ingot grown with the magnetic field strength ratio (vertical magnetic field component/horizontal magnetic field component) of 0.40, and FIG. 8 shows those for a crystal grown with the ratio of 0.26.

As clearly seen from FIGS. 7 and 8, while the fluctuation in the interstitial oxygen concentration was large with the condition of the magnetic field strength ratio of 0.26 (FIG. 8), the standard deviation of the interstitial oxygen concentration was as small as 0.16 ppma with the ratio of 0.40, which was an extremely good value (FIG. 7).

Table 1 shows, as an index of stability of interstitial oxygen concentration, the standard deviations of the data obtained from the results of the measurement for the interstitial oxygen concentration of samples obtained from positions on the crystal shoulder side of portions having a constant diameter of the crystals grown with the aforementioned five kinds of conditions. A smaller value of standard deviation shows that the fluctuation in the interstitial oxygen concentration along the growth axis direction is smaller, and thus the crystal has higher quality. As seen from the results of Table 1, the standard deviation became-small within the range of the magnetic field strength ratio of 0.3 to 0.5, and thus the effect of the present invention is clearly demonstrated.

TABLE 1

| Magnetic field component strength ratio (vertical/horizontal) | 0.26 | 0.34 | 0.40 | 0.44 | 0.52 |
|---|---|---|---|---|---|
| Oxygen concentration standard deviation (ppma): JEIDA | 0.40 | 0.18 | 0.16 | 0.16 | 0.58 |

EXAMPLE 2

Then, an iron ring member having a diameter of 100 cm, width of 5 cm and thickness of 0.4 cm was provided around the single crystal growing apparatus used in Example 1, in which the positional relationship of a magnetic field generation apparatus with respect to the single crystal growing apparatus was adjusted so that the magnetic field strength ratio at the silicon melt surface should be 0.26, which provided large fluctuation in the interstitial oxide concentration. As a result, the magnetic field strength ratio at the surface of the silicon melt in the quartz crucible could be changed to 0.4.

A single crystal was grown with the same conditions as Example 1 except that the magnetic field strength ratio was set to be 0.4 by using the above production apparatus provided with the magnetic field strength adjusting member. Then, the interstitial oxygen concentration of the crystal along the growth axis direction was measured. As a result, small fluctuation similar to that shown in FIG. 7 was obtained.

Therefore, even when a magnetic field strength ratio cannot be selected within the above-defined range because of interference between the single crystal growing apparatus and the magnetic field generation apparatus or the like, the magnetic field distribution can easily be changed to obtain a desired magnetic strength ratio by the method of providing a magnetic field strength adjusting member, and thus a silicon single crystal of high quality can be produced.

The present invention is not limited to the embodiments described above. The above-described embodiments are mere examples, and those having the substantially same structure as that described in the appended claims and providing the similar functions and advantages are included in the scope of the present invention.

For example, in the above specific embodiments, the crystals were grown under a condition that one of a low temperature region and a high temperature region generated at the silicon melt surface in the crucible should always locate at the center of the melt surface concerning the first embodiment of the present invention. However, a crystal-may be grown along an eccentric axis. Further, while an atmospheric gas flow-guide cylinder provided with a notch was used for controlling the blowing manner of the atmospheric gas for the crystal surface, the flow-guide cylinder may be disposed along an eccentric axis, and thereby sufficient effect can be attained.

Moreover, as for the size of crystal to be grown, although cases where silicon single crystals having a diameter of 200 mm (8 inches) were grown were exemplified in the aforementioned specific embodiments, the present invention is not limited to these, and can be used irrespective of the diameter. For example, it can also be used for silicon single crystals having a diameter of 10 inches, 16 inches or larger.

What is claimed is:

1. A silicon single crystal produced by the horizontal magnetic field Czochralski method, wherein variation magnitude of interstitial oxygen concentration is 0.5 ppma or less in an arbitrary section with a length of 40 mm along the crystal growth axis direction of the single crystal pulled from a silicon melt contained in a quartz crucible.

2. A method for producing a silicon single crystal by growing a single crystal ingot while a magnetic field perpendicular to a crystal growth axis is applied to a silicon melt contained in a quartz crucible-during pulling of the single crystal from the melt contained in the quartz crucible, wherein the crystal growth is performed so that one of a low temperature region and a high temperature region generated at a surface of the silicon melt contained in the crucible should always cover a solid-liquid interface of the crystal growth.

3. The method for producing a silicon single crystal according to claim 2, wherein the crystal growth is performed so that one of the low temperature region and the high temperature region should always locate at the center of the surface of the silicon melt.

4. The method for producing a silicon single crystal according to claim 3, wherein the low temperature region or the high temperature region of the melt surface is detected by a radiation pyrometer, thermocouple or CCD camera.

5. The method for producing a silicon single crystal according to claim 4, wherein the monitoring of the temperature distribution of the melt surface with the radiation pyrometer, thermocouple or CCD camera is always performed continuously during the crystal growth, and thereby the crystal growth is performed so that one of the low temperature region and the high temperature region generated at the melt surface should always cover the solid-liquid interface of the crystal growth.

6. The method for producing a silicon single crystal according to claim 4, wherein a crystal growth experiment is preliminarily performed to obtain such conditions that one of the low temperature region and the high temperature region generated at the melt surface should always cover the solid-liquid interface of the crystal growth, and the conditions are applied to the crystal growth operation based on the monitoring of the temperature distribution of the melt surface with the radiation pyrometer, thermocouple or CCD camera.

7. The method for producing a silicon single crystal according to claim 2, wherein the low temperature region or the high temperature region of the melt surface is detected by a radiation pyrometer, thermocouple or CCD camera.

8. The method for producing a silicon single crystal according to claim 7, wherein the monitoring of the temperature distribution of the melt surface with the radiation pyrometer, thermocouple or CCD camera is always performed continuously during the crystal growth, and thereby the crystal growth is performed so that one of the low temperature region and the high temperature region generated at the melt surface should always cover the solid-liquid interface of the crystal growth.

9. The method for producing a silicon single crystal according to claim 7, wherein a crystal growth experiment is preliminarily performed to obtain such conditions that one of the low temperature region and the high temperature region generated at the melt surface should always cover the solid-liquid interface of the crystal growth, and the conditions are applied to the crystal growth operation based on the monitoring of the temperature distribution of the melt surface with the radiation pyrometer, thermocouple or CCD camera.

10. A silicon single crystal produced by the method for producing a silicon single crystal according to claim 2.

11. A silicon single crystal wafer obtained from a silicon single crystal produced by the method for producing a silicon single crystal according to claim 2.

12. A method for producing a silicon single crystal by growing a single crystal ingot while a magnetic field perpendicular to a crystal growth axis is applied to a silicon melt contained in a quartz crucible during pulling of the single crystal from the melt contained in a quartz crucible, wherein a ratio of vertical magnetic field component to horizontal magnetic field component for magnetic field strength at the crystal center of the surface of the silicon melt contained in the quartz crucible is 0.3 or more and 0.5 or less.

13. A method for producing a silicon single crystal, comprising adjusting at least one of a position of a magnetic field generation apparatus and a position of the quartz crucible so that the magnetic field strength ratio at the silicon melt surface during the single crystal growth is within the range defined in claim 12.

14. A method for producing a silicon single crystal, wherein a magnetic field strength adjusting member is provided around a magnetic field generation apparatus or a single crystal growing apparatus, and the position thereof is adjusted so that the magnetic field strength ratio at the silicon melt surface during the single crystal growth is within the range defined in claim 12.

15. An apparatus for producing a silicon single crystal by pulling a single crystal from a silicon melt contained in a quartz crucible, which is provided with a magnetic field generation apparatus for applying a magnetic field perpendicular to the crystal growth axis to the melt in the quartz crucible, wherein a member for controlling a magnetic field strength ratio is provided around the magnetic field generation apparatus or an apparatus for growing a single crystal.

* * * * *